United States Patent
Xiao et al.

(10) Patent No.: US 10,680,547 B2
(45) Date of Patent: Jun. 9, 2020

(54) SUPPRESSING RESONANCE IN ULTRA LONG MOTOR CABLE

(71) Applicant: Rockwell Automation Technologies, Inc., Mayfield Heights, OH (US)

(72) Inventors: Yuan Xiao, Kitchener (CA); Ye Zhang, Oakville (CA); Ehsan Al-Nabi, Kitchener (CA); Richard L. Piekarz, Kitchener (CA)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

(21) Appl. No.: 16/033,321

(22) Filed: Jul. 12, 2018

(65) Prior Publication Data

US 2020/0021234 A1    Jan. 16, 2020

(51) Int. Cl.
*H02P 27/08*    (2006.01)
*H02P 29/50*    (2016.01)
(Continued)

(52) U.S. Cl.
CPC ............. *H02P 29/50* (2016.02); *H02M 1/44* (2013.01); *H02P 27/08* (2013.01); *H03H 7/06* (2013.01); *H02M 5/4585* (2013.01)

(58) Field of Classification Search
CPC .. H02M 1/12; H02M 1/126; H02M 2001/123; H02M 5/458; H02M 5/4585; H03H 7/06; H03H 7/0138; H03H 7/1741
See application file for complete search history.

(56) References Cited

U.S. PATENT DOCUMENTS

| | | | | |
|---|---|---|---|---|
| 7,957,166 B2 * | 6/2011 | Schnetzka | ............. | H02M 7/003 363/40 |
| 8,325,500 B2 * | 12/2012 | Schueneman | ......... | H02M 1/126 363/47 |

(Continued)

FOREIGN PATENT DOCUMENTS

| JP | 2001204136 A | 7/2007 |
|---|---|---|
| WO | WO 2009/013996 A1 | 1/2009 |

OTHER PUBLICATIONS

A. F. Moreira, T. A. Lipo, G. Venkataramanan and S. Bernet, "Modeling and Evaluation of dv/dt Filters for AC Drives with High Switching Speed", 9th European Conference on Power Electronics and Applications, Graz, Austria, Aug. 2001.

(Continued)

*Primary Examiner* — Rina I Duda
(74) *Attorney, Agent, or Firm* — Fay Sharpe LLP

(57) ABSTRACT

The disclosed examples provide an easy and low-loss solution to reduce voltage stress on motor and cable in inverter-fed motor systems by suppressing resonances on the motor cable with apparatus coupled between the inverter output and the motor cable. Disclosed examples include various methods to mitigate voltage stress on both motor and cable, including an output filter circuit with a cable side parallel RL circuit between an inverter output and a motor cable, and an inverter to provide an inverter output signal to the output filter circuit to drive a load through the motor cable, where the cable side parallel RL circuit includes a resistor coupled in series between the inverter output and the motor cable, and an inductor connected in parallel with the resistor.

18 Claims, 7 Drawing Sheets

(51) Int. Cl.
   *H02M 1/44* (2007.01)
   *H03H 7/06* (2006.01)
   *H02M 5/458* (2006.01)

(56) References Cited

U.S. PATENT DOCUMENTS

| | | | | |
|---|---|---|---|---|
| 2011/0050135 A1* | 3/2011 | Higuchi | ............... | H02M 1/126 |
| | | | | 318/400.2 |
| 2013/0241451 A1* | 9/2013 | Wei | ........................ | H02J 9/005 |
| | | | | 318/400.3 |
| 2016/0248334 A1* | 8/2016 | Patel | ........................ | H03H 7/06 |
| 2018/0138849 A1 | 5/2018 | Royak et al. | | |

OTHER PUBLICATIONS

M.M. Swamy and M.A. Baumgardner, "New normal dv/dt filter with a built-in resistor failure detection circuit", IEEE Trans. Ind. Appl., vol. 53, No. 3, pp. 2149-2158, May/Jun. 2017.

Y. Liu, L. Wang, H. Gao, H. Zhang and D. Xu, "Overvoltage mitigation of submersible motors with long cables of different lengths", in Conf. Electrical Machines and Systems, 2014, pp. 638-644.

Z. Liu, G. Skibinski, "Method to Reduce Overvoltage on AC Motor Insulation from Inverters with Ultra-Long Cable", IEEE Electric Machines and Drives Conference (IEMDC), 2017.

José Rodríguez, , Jorge Pontt, César Silva, Rodrigo Musalem, Patricio Newman, René Vargas, andSergio Fuentes, "Resonances and Overvoltages in a Medium-Voltage Fan Motor Drive With Long Cables in an Underground Mine", IEEE Trans. Ind. Appl., vol. 42, No. 3, pp. 856-863 May/Jun. 2006.

Matt Smochek, Anthony F. Pollice, Mukul Rastogi, and Mark Harshman "Long Cable Applications From a Medium-Voltage Drives Perspective", IEEE Trans. Ind. Appl., vol. 52, No. 1, pp. 645-652, Jan./Feb. 2016.

Extended European Search Report of European Application No. 19185408.2-1201 dated Nov. 6, 2019, 8 pages.

* cited by examiner

US 10,680,547 B2

SUPPRESSING RESONANCE IN ULTRA LONG MOTOR CABLE

INCORPORATION BY REFERENCE

U.S. Patent Application Publication No. 2018/0138849 A1 to Royak et al., entitled CURRENT CONTROL OF MOTOR DRIVES WITH OUTPUT SINEWAVE FILTER, and filed as U.S. patent application Ser. No. 15/351,989 on Nov. 15, 2016, now U.S. Pat. No. 10,020,766, and granted on Jul. 10, 2018, is hereby incorporated by reference in its entirety.

BACKGROUND INFORMATION

The subject matter disclosed herein relates to power conversion, and more specifically to suppressing or controlling motor cable resonance.

BRIEF DESCRIPTION

Various aspects of the present disclosure are now summarized to facilitate a basic understanding of the disclosure, wherein this summary is not an extensive overview of the disclosure, and is intended neither to identify certain elements of the disclosure, nor to delineate the scope thereof. Rather, the primary purpose of this summary is to present the concept of the disclosure in a simplified form prior to the more detailed description that is presented hereinafter. The present disclosure provides various methods to mitigate voltage stress on both motor cable and motor. Examples include an output filter circuit with a cable side parallel RL circuit between an inverter output and a motor cable, and an inverter to provide an inverter output signal to the output filter circuit to drive a load through the motor cable, where the cable side parallel RL circuit includes a resistor coupled in series between the inverter output and the motor cable, and an inductor connected in parallel with the resistor. Example methods include connecting an output filter circuit with a cable side parallel RL circuit between an inverter output and a motor cable, and providing an inverter output signal from the inverter output to the output filter circuit to drive a load through the motor cable.

DETAILED DESCRIPTION

Figure 1:
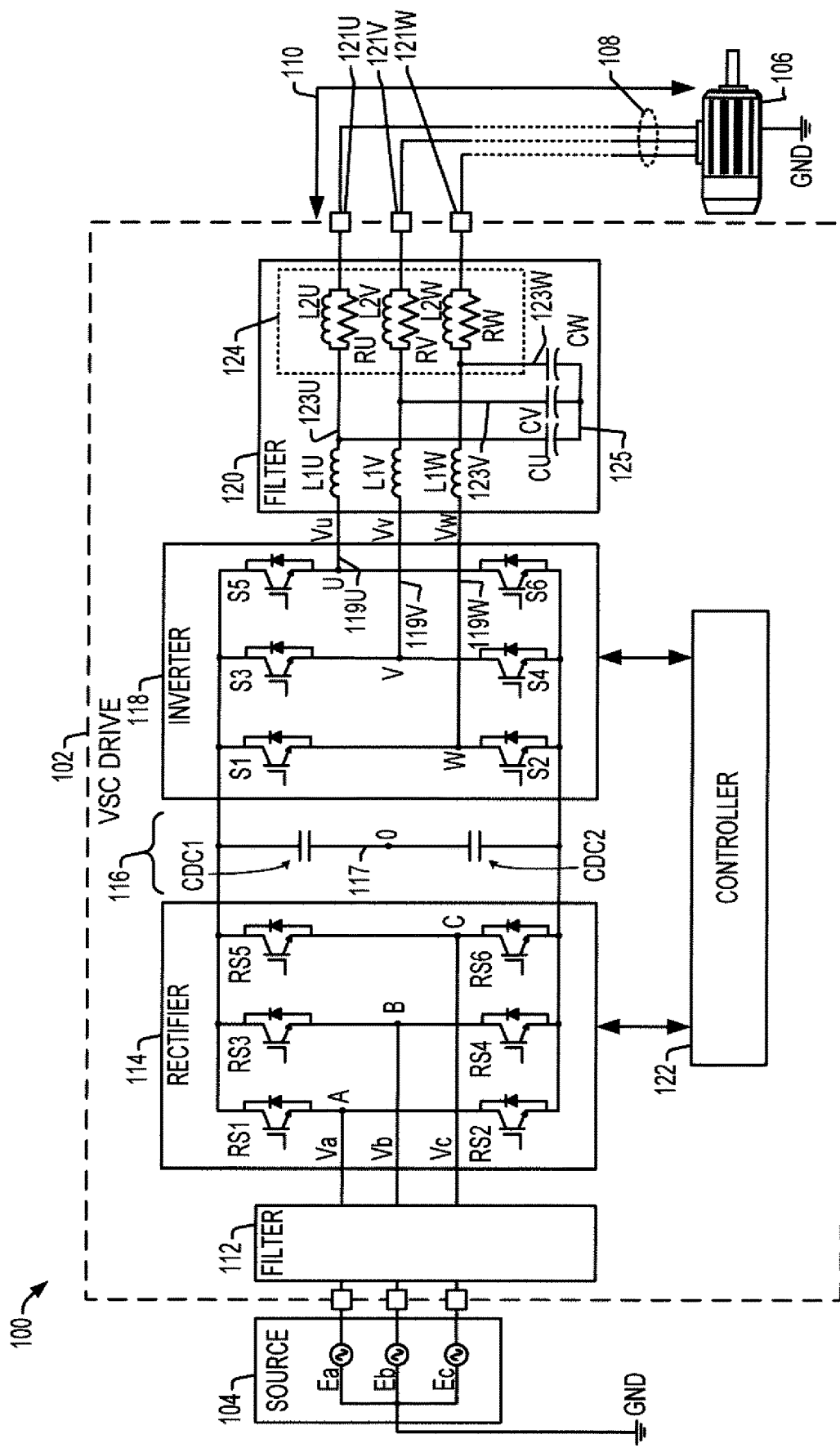
FIG. 1 is a schematic diagram of a voltage source converter (VSC) power conversion system.

Referring now to the figures, several embodiments or implementations are hereinafter described in conjunction with the drawings, wherein like reference numerals are used to refer to like elements throughout, and wherein the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to . . . " Also, the term "couple" or "couples" is intended to include indirect or direct electrical or mechanical connection or combinations thereof. For example, if a first device couples to or is coupled with a second device, that connection may be through a direct electrical connection, or through an indirect electrical connection via one or more intervening devices and connections.

FIG. 1 shows an example industrial system 100 that includes a type motor drive power conversion system 102 that receives and converts AC electrical input power from a source 104 to drive a motor load 106 through a long motor cable 108 having a cable length 110. The AC input and output of the converter 102 are three phase configurations in the illustrated examples. Other implementations are possible using any combination of single or multiphase inputs and outputs to drive a motor 106 or other type of load.

The motor drive 102 receives single or multiphase AC input power from a power source 104 and converts this to a DC bus voltage using the rectifier 114 which provides a DC output voltage to a DC bus circuit 116 having one or more capacitors CDC. The example power conversion system 102 in FIG. 1 is a voltage source converter (VSC) motor drive, which includes an input filter 112, a rectifier 114, a DC bus circuit 116 with DC bus capacitors CDC1 and CDC2 that define a center node 117 (e.g., zero volts), an inverter 118 with an inverter output 119 (e.g., output phase lines 119U, 119V and 119W), an output filter circuit (e.g., filter) 120 with output terminals 121U, 121V and 121W, and a controller or control circuit 122. The example three phase AC power source 104 provides AC phase voltage signals Ea, Eb and Ec to the inputs of the input filter 112, and the filter 112 provides filtered AC input voltage signals Va, Vb and Vc to the respective phase input lines A, B and C of the rectifier 114.

The rectifier 114 can be a passive rectifier including one or more diode rectifier components, or may be an active front end (AFE) system with one or more rectifier switching devices RS1, RS2, RS3, RS4, RS5 and RS6 (e.g., IGBTs, etc.) operated according to rectifier switching control signals from the controller 122 to convert input AC electrical power to provide the DC bus voltage in the DC bus circuit 116. Other configurations are possible in which the drive 102 receives input DC power from an external source (not shown) to provide an input to the inverter 118, in which case the rectifier 114 may be omitted. The illustrated motor drive 102 is a voltage source converter configuration including one or more capacitive storage elements in the DC bus circuit 116. The DC bus circuit 116 may include a single capacitor CDC or multiple capacitors (e.g., CDC1 and CDC2 in FIG. 1) connected in any suitable series, parallel and/or series/parallel configuration to provide a DC bus capacitance across the inverter input terminals.

The controller 122 in one example includes a processor and an associated electronic memory (not shown in FIG. 1) which stores program instructions to implement a closed loop control program to regulate or control one or more of voltage, current, speed, torque, etc. The controller 122 in certain embodiments implements a motor speed and/or position and/or torque control scheme in which the controller 122 selectively provides the switching control signals to the inverter switches S1-S6 in a closed and/or open-loop fashion according to one or more setpoint values such as a motor speed setpoint. The setpoint in one example is a signal or value generated by the controller 122, or a fixed setpoint value, or such setpoint value can be received from an external system (not shown). In practice, the motor drive 102 may also receive a torque setpoint and/or a position (e.g., angle) setpoint, and such desired signals or values (setpoint(s)) may be received from a user interface and/or from an external device such as a distributed control system, etc. (not shown). As used herein, a signal can be an analog signal, such as a current or a voltage signal, or a signal can include digital values generated or consumed by the controller 122.

Figure 2:
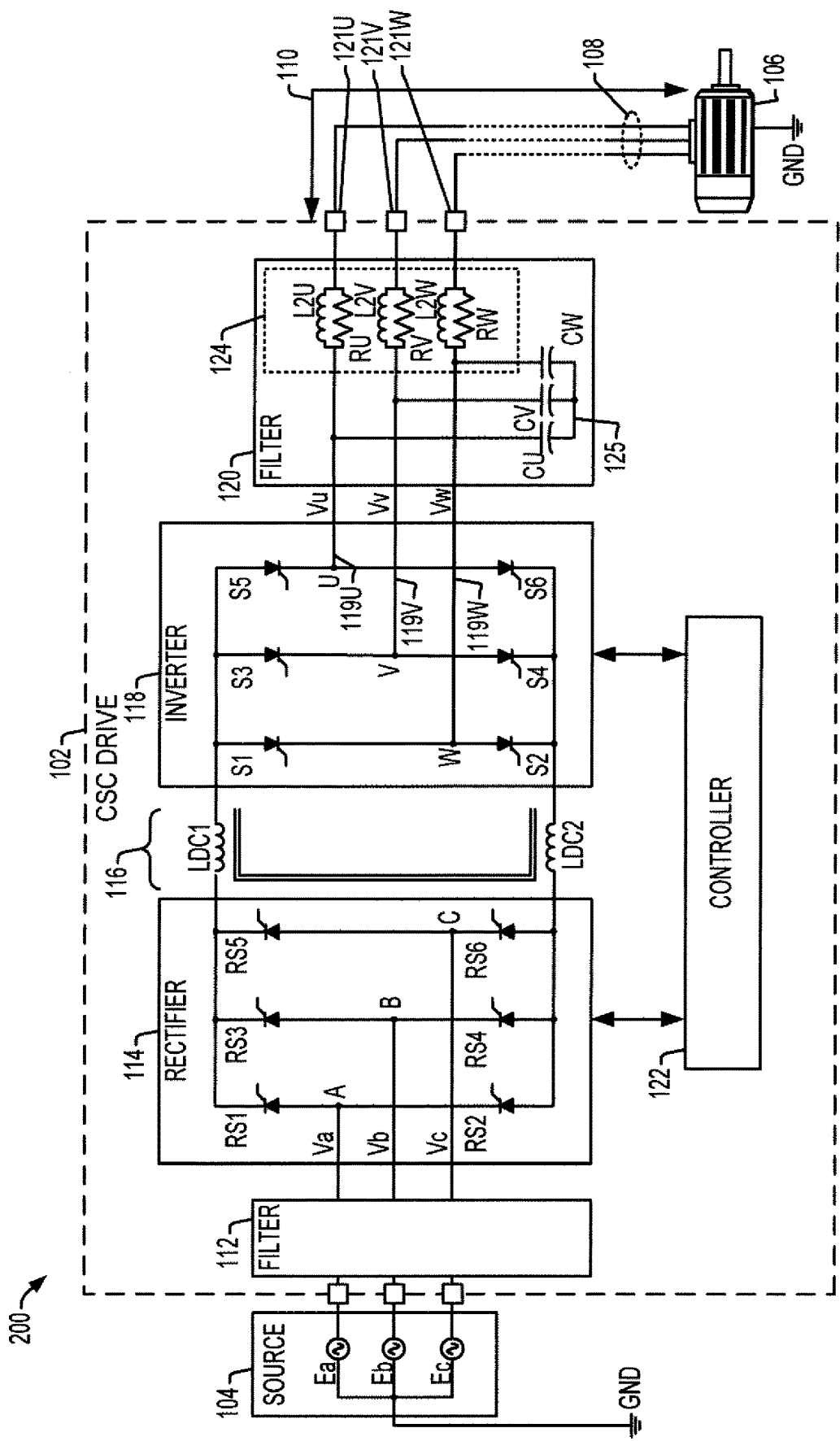
FIG. 2 is a schematic diagram of a current source converter (CSC) power conversion system.

As shown in FIG. 2 below, various concepts of the present disclosure may be implemented in association with current source converter architectures in which a DC bus circuit 116 includes one or more inductive storage elements, such as one or more series-connected inductors situated between the source of DC power (e.g., rectifier 114 or external DC source) and the input of the inverter 118. In other possible implementations, the motor drive 102 includes a direct DC input to receive input power from an external source (not shown), and in certain embodiments the rectifier 114 and DC bus circuit 116 may both be omitted.

In certain examples, a transformer (not shown) can be connected between the output filter 120 and the motor cable 108. In one example, the inverter 118 operates according to pulse width modulated (PWM) inverter switching control signals from the controller 122. The example PWM inverter 118 provides output currents and voltages that include a number of pulses, and the output filter circuit 120 reduces high frequency content caused by pulse width modulation of the inverter switches. Conventional output filters designed protect a motor from high frequency content caused by the PWM operation of an inverter, do not adequately protect the motor cable from voltage stresses, particularly for motor cables having a very long cable length. For example, extremely long motor cables (e.g., 10-20 km or more) are sometimes used in conjunction with electronic submersible pump (ESP) motors 106 for deep well pumping applications and other systems that have a motor driven through an output filter. In such application, an output transformer is used, such as a step-up transformer, to boost the motor drive output voltage, allowing use of a low-voltage drive to power a medium voltage induction motor, and/or to reduce I²R losses and facilitate use of a smaller diameter cable wire for long cable runs between the motor drive and the driven motor.

Overvoltage may occur on cables and motors due to a long cable resonance phenomenon. In addition, the suppression of the overvoltage caused by long cable resonance is important with respect to the insulation of cables and motors. Disclosed examples provide different example filter circuits for use in combination with voltage source inverter (VSI) and current source inverter (CSI) power conversion systems as shown in FIGS. 1 and 2, respectively. In this regard, certain applications employ output filters between the motor drive inverter output and the transformer primary in order to suppress reflected wave voltage spikes associated with pulse width modulated (PWM) variable frequency drives. However, long cable resonance is not the ringing due to inverter switching, and the resonance frequency associated with the long cable resonance is independent from the variable frequency drive (VFD) type (VSI or CSI) and switching devices used. The example inverter 118 includes a DC input with first and second (e.g., positive and negative DC bus lines) and the three phase inverter output 119U, 119V and 119W (e.g., for output phase lines U, V and W, respectively). The inverter 118 also includes switching devices S1-S6 (e.g., IGBTs, GCTs, SGCTs or other switch types) that are individually coupled between a corresponding line of the DC input and a corresponding phase (U, V or W) of the inverter output 119. The controller 122 provides inverter switching control signals to operate the switches S1-S6 to provide a three phase inverter output signal (e.g., voltages Vu, Vv, Vw) at the inverter output 119.

The output filter circuit 120 includes a first filter circuit (e.g., first inductors L1U, L1V and L1W and capacitors CU, CV and CW) coupled with the filter input 119, as well as a parallel RL circuit 124 coupled between the first filter circuit and the motor cable 108. In this manner, the cable side parallel RL circuit 124 is coupled between an inverter output 119 and a motor cable 108. In the example of FIG. 1, the inverter output 119 is a three phase output, the output filter circuit 120 is a three phase circuit, and the cable side parallel RL circuit 124 is a three phase circuit. In the example three phase system of FIG. 1, each phase of the cable side parallel RL circuit 124 includes a resistor RU, RV or RW coupled in series between the corresponding inverter output 119U, 119V or 119W and the motor cable 108 at the corresponding filter output terminal 121U, 121V or 121W, respectively. Each phase of the cable side parallel RL circuit 124 also includes an inductor L2U, L2V or L2W connected in parallel with the corresponding resistor RU, RV or RW. In certain examples, the inductors L2U, L2V, L2W of the cable side parallel RL circuit 124 have inductance values determined according to the characteristic impedance of the motor cable 108. In this manner, the in-line inductors L2U, L2V and L2W conduct current at the appropriate frequencies to drive the motor 106 efficiently, while the in-line resistors RU, RV and RW suppress or mitigate (e.g., reduce) voltage stresses on the long motor cable 108.

The disclosed filter circuitry examples 120 with included cable side parallel RL circuits 124 advantageously filter the inverter output harmonics to mitigate or minimize (e.g., reduce) the harmonics injected into the motor cable 108. Moreover, the output filter 120 also mitigates or minimizes (e.g., reduces) voltage amplification as well as at least partially eliminating (e.g., reducing) the harmonics output to the motor cable 108 over a desired range of motor operation conditions. This is in contrast to conventional output filter approaches that operated only in one of two categories. One approach attempted to decrease the dv/dt of an inverter output waveform so as to reduce the amplitude of reflected voltage through inverter output reactors, inverter output dv/dt filters or inverter output sine-wave filters. Another approach attempted to the dv/dt of inverter output waveform so as to reduce the amplitude of reflected voltage through decrease the mismatch between a cable surge impedance and the motor impedance so as to reduce the amplitude of the reflected voltage through line termination network (LTN) or cable terminator circuitry at the motor terminals. However, certain applications cannot accommodate additional motor end circuitry. Neither of these approaches meet both requirements for mitigates or minimizes (e.g., reduces) voltage amplification as well as at least partially eliminating (e.g., reducing) the harmonics output to the motor cable 108. The filter 120 can be used in other applications apart from motor drive output filtering for long cable motor drive systems.

The power conversion system 102 of FIG. 1 is a voltage source converter with a DC bus capacitor (e.g., CDC1, CDC2) coupled with the DC input of the inverter 118. The output filter circuit 120 in this example includes a first filter circuit and the parallel RL circuit 124. The first filter circuit of each phase includes a first inductor (e.g., L1U, L1V or L1W) connected between the inverter output 119 and a corresponding internal node (e.g., 123U, 123V or 123W), as well as a corresponding filter capacitor (e.g., CU, CV or CW) connected between the internal node and a reference node 125 (e.g., for the Y-connected filter capacitor configuration of FIG. 1). In this example, the resistor RU, RV or RW and the inductor L2U, L2V or L2W of the cable side parallel RL circuit 124 are connected in parallel with one another between the corresponding internal node 123U, 123V or 123W and the motor cable 108 via the corresponding filter output terminal 121U, 121V or 121W. In this example, the individual resistors RU, RV and RW of the cable side parallel RL circuit 124 include a first terminal connected to the corresponding internal node 123U, 123V or 123W, and a second terminal connected to the corresponding phase line of the motor cable 108. Also, the individual inductors L2U, L2V and L2W of the circuit 124 include a first terminal connected to the corresponding internal node 123U, 123V or 123W, as well as a second terminal connected to the motor cable 108.

FIG. 2 shows another example implementation that includes a current source converter motor drive power conversion system 102 with an inverter 118 driving a motor load 106 through an output filter and a long motor cable. The CSC example of FIG. 2 is generally as described above, with the following modifications to the DC circuit 116 and the output filter circuit 120. In this example, the power conversion system 102 is a current source converter with one or more DC link inductors (e.g., LDC1 and LDC2) coupled with the DC input of the inverter 118. The output filter circuit 120 in this example includes a first filter circuit and the parallel RL circuit 124. The first filter circuit in each individual phase of the CSC example in FIG. 2 includes a capacitor (e.g., CU, CV or CW) connected between the inverter output 119 and the reference node 125 (e.g., a Y-configuration). In each phase, moreover, the resistor RU, RV or RW and the corresponding inductor L2U, L2V or L2W of the cable side parallel RL circuit 124 are connected in parallel with one another between the inverter output 119 and the motor cable 108 (e.g., between the lines 119 and the output terminals 121).

Figure 3:
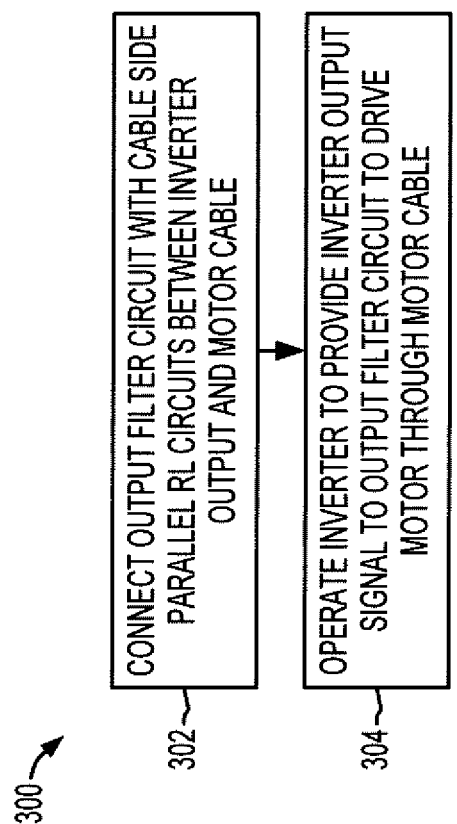
FIG. 3 is a flow diagram of a method to control voltage stress on a motor cable.

FIG. 3 shows a method 300 to control (e.g., reduce) voltage stress on a motor cable. The disclosed subject matter includes a system as well as a computer-readable medium having computer-executable instructions for performing the acts and/or events of the various methods of the disclosed subject matter. The example method 300 includes connecting, at 302, an output filter circuit 120 with a cable side parallel RL circuit 124 between an inverter output 119 and a motor cable 108. The method 300 also includes providing, at 304, an inverter output signal (e.g., Vu, Vv, Vw) from the inverter output 119 to the output filter circuit 120 to drive a load 106 through the motor cable 108, for example, by operating the inverter 118 according to switching control signals from the controller 122. In one example, connecting the output filter circuit 120 between the inverter output 119 and the motor cable 108 (at 302 in FIG. 3) includes connecting a first inductor (e.g., L1U, L1V or L1W) between the inverter output 119 and an internal node (e.g., 123U, 123V or 123W), connecting a capacitor (e.g., CU, CV or CW) between the internal node and a reference node (125), as well as connecting the resistor (e.g., RU, RV or RW) and the inductor (e.g., L2U, L2V or L2W) of the cable side parallel RL circuit 124 in parallel with one another between the internal node and the motor cable 108 (e.g., as shown in FIG. 1 above). In certain examples, connecting the output filter circuit 120 (e.g., at 302) between the inverter output 119 and the motor cable 108 includes connecting a capacitor (e.g., CU, CV or CW) between the inverter output 119 and a reference node 125, as well as connecting the resistor (e.g., RU, RV or RW) and the inductor (e.g., L2U, L2V or L2W) of the cable side parallel RL circuit 124 in parallel with one another between the inverter output 119 and the motor cable 108 (e.g., as shown in FIG. 2 above).

Figure 4:
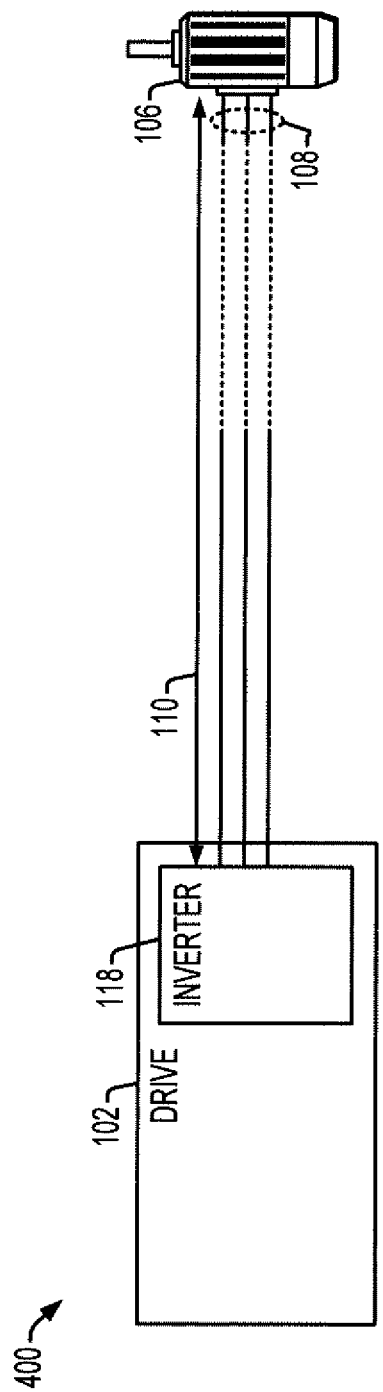
FIG. 4 is a simplified schematic diagram of a motor drive power conversion system with a long motor cable and no output filter circuit.
Figure 5:
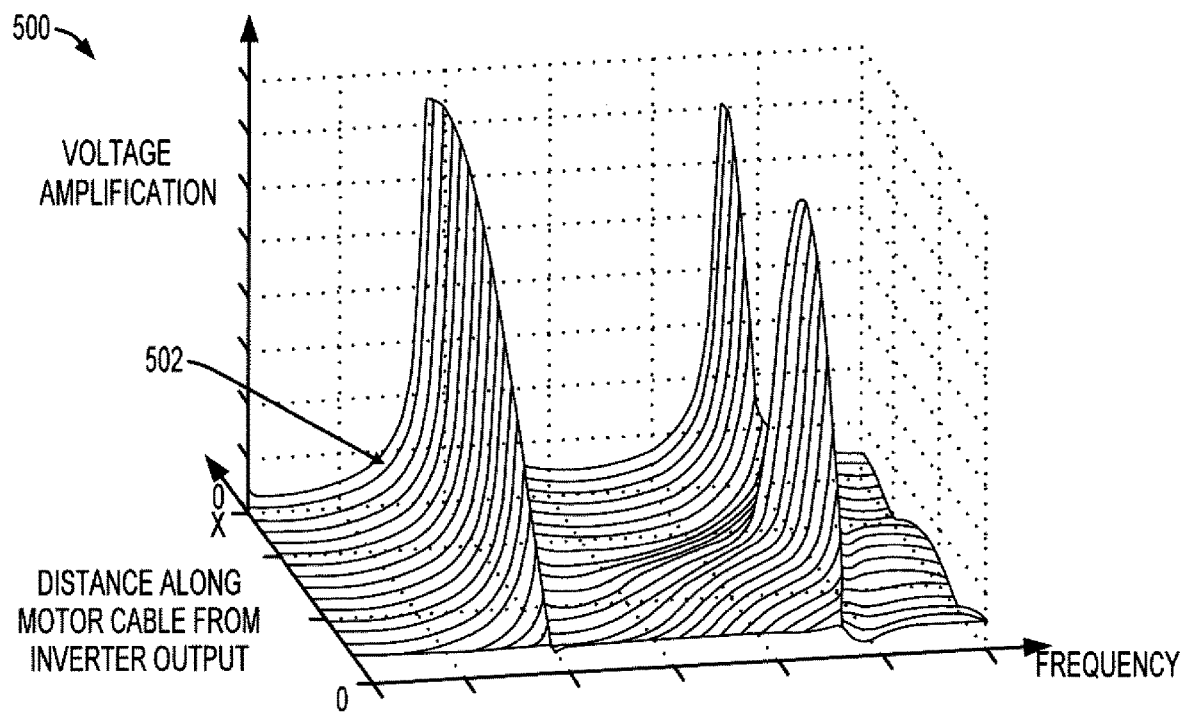
FIG. 5 is a graph of an example voltage amplification curve for the cable of FIG. 4.
Figure 6:
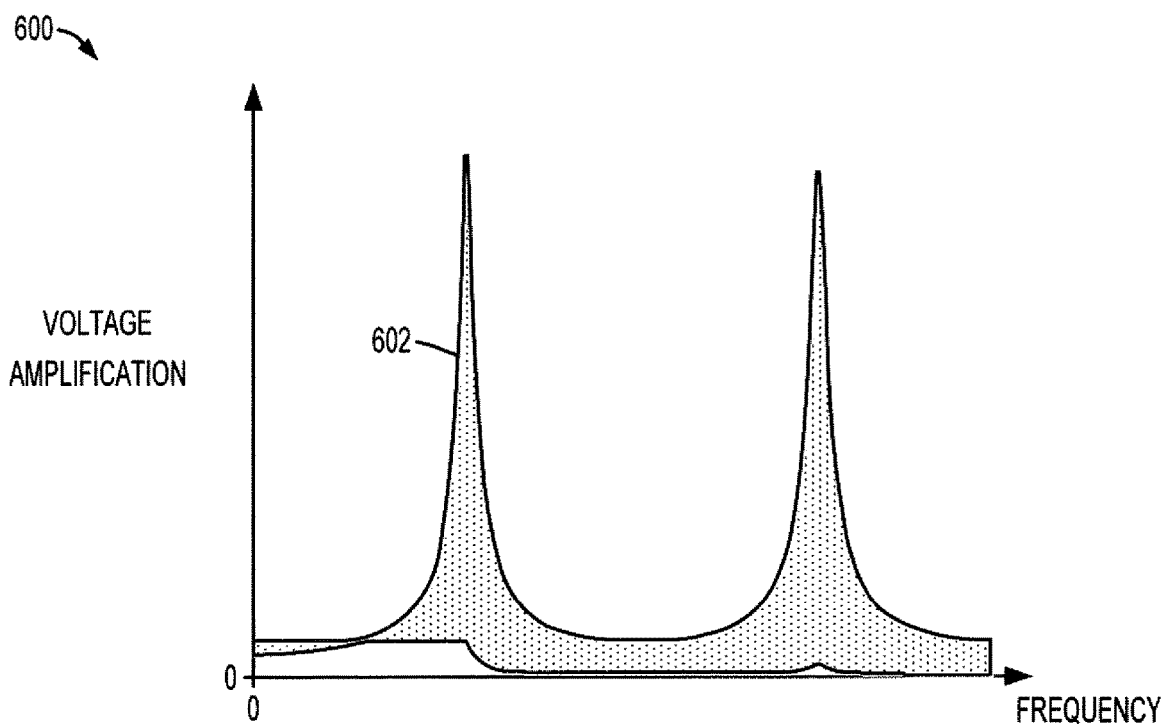
FIG. 6 is a graph of a two-dimensional front view of the voltage amplification curve of FIG. 5 for the cable of FIG. 4 with no output filter circuit.
Figure 7:
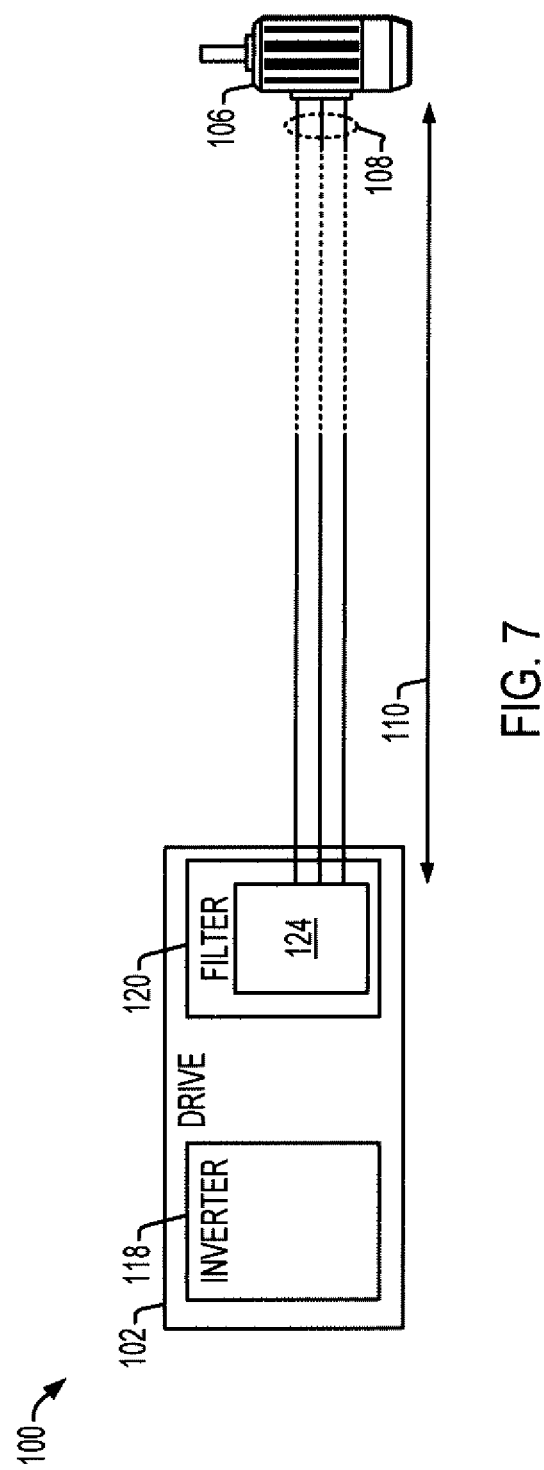
FIG. 7 is a simplified schematic diagram of another motor drive power conversion system with a long motor cable and an output filter circuit.

Referring now to FIGS. 4-6, FIG. 4 shows a simplified example motor drive power conversion system 400 with a long motor cable and no output filter circuit. A graph 500 in FIG. 5 shows an example voltage amplification curve 502 for the cable of FIG. 4 with no output filter circuit at different distances along the cable to the inverter output over different frequencies of inverter output signal. In addition, FIG. 6 shows voltage amplification curve 602 which is the two-dimensional front view of FIG. 5 for the cable of FIG. 4 with no output filter circuit. In the illustrated examples, the distance of zero represents the voltage amplification performance at the beginning of the motor cable 108 connected to the output filter 120, and increasing distances represent positions in the cable 108 further toward the motor 106. In FIGS. 5 and 6, the cable length distance labeled "X" is the far end of the motor cable 108 at the motor 106. As seen in the graphs 500 and 600 of FIGS. 5 and 6, the voltage amplification within the cable 108, and the corresponding result in voltage stresses on the cable 108, are significant at multiple frequencies, and generally, the frequencies decrease with increasing motor cable length (e.g., cable length 110 in FIGS. 1 and 2 above).

Figure 8:
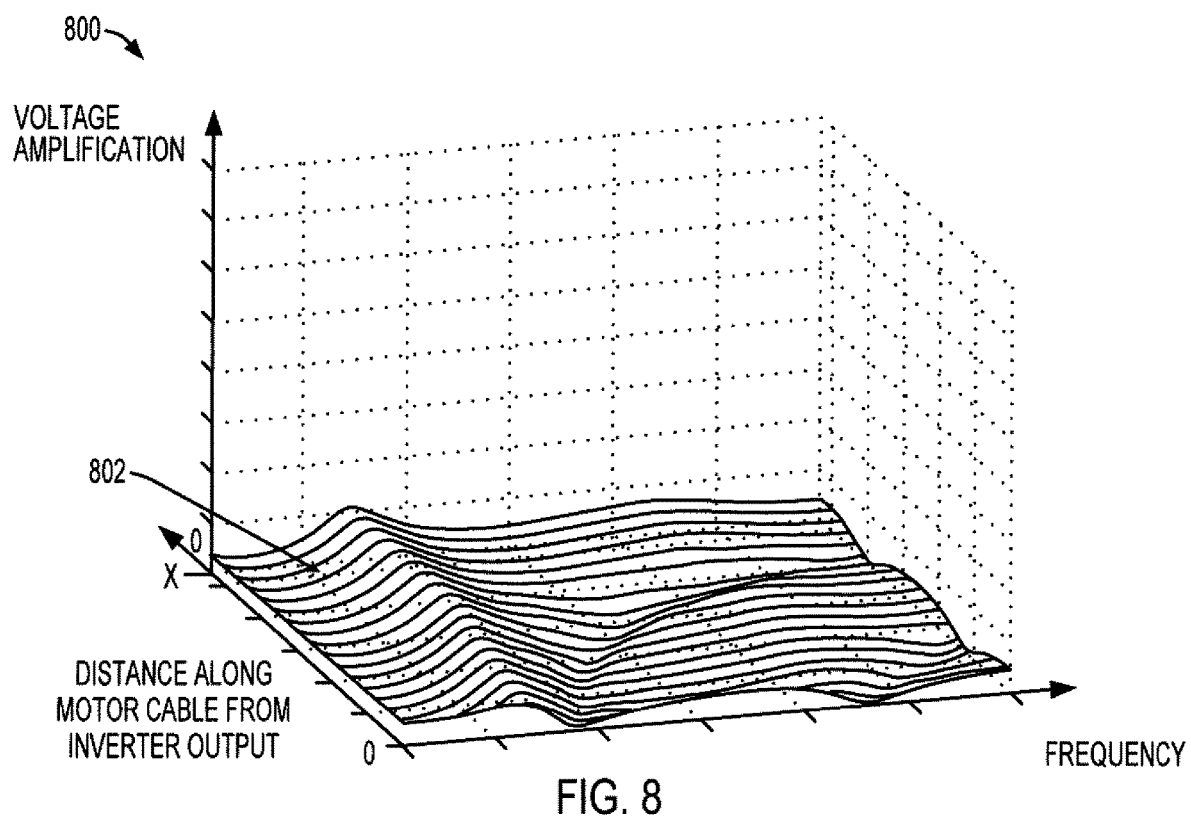
FIG. 8 is a graph of an example two-dimensional voltage amplification curve for the motor cable of FIGS. 2 and 7.
Figure 9:
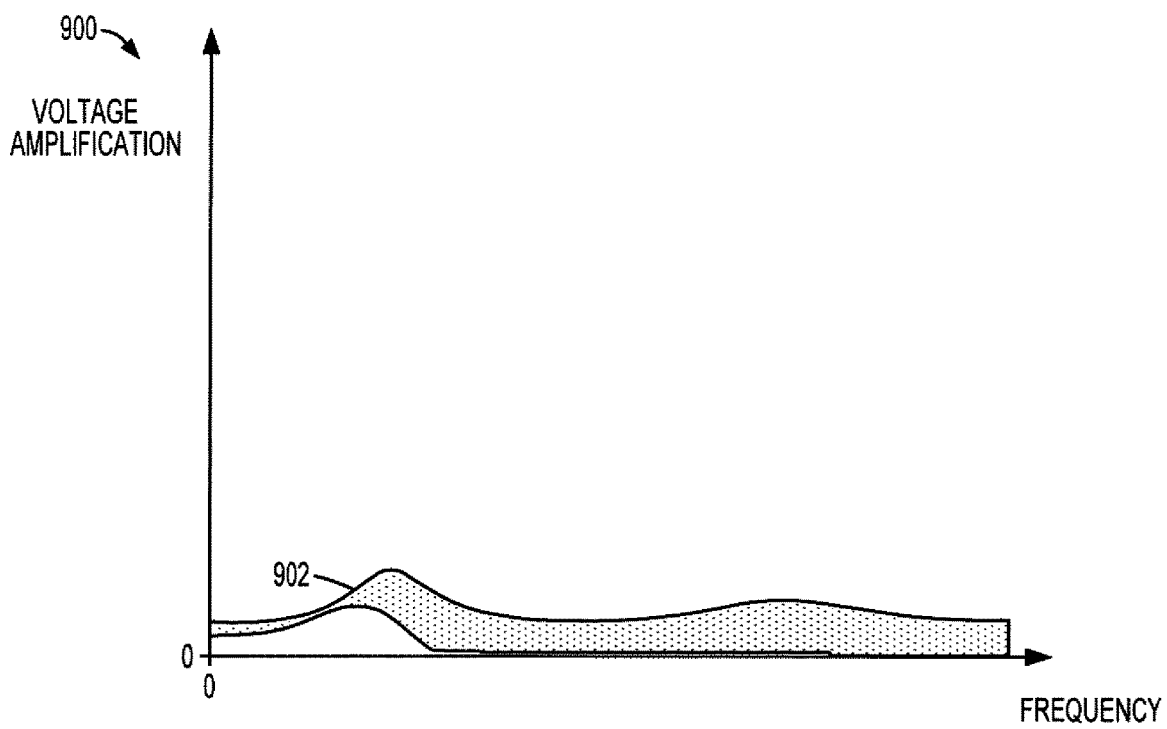
FIG. 9 is a graph of a two-dimensional front view of the voltage amplification curve of FIG. 8 for the cable of FIGS. 2 and 7 with an output filter circuit.
Figure 10:
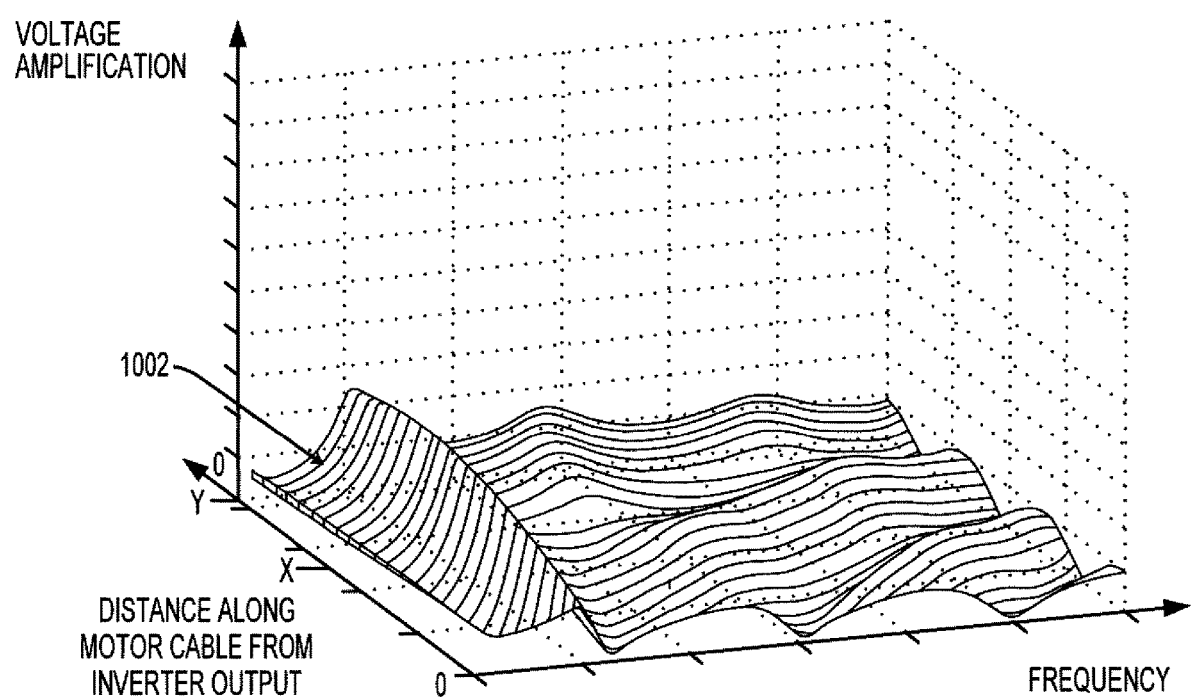
FIG. 10 is a graph of another example two-dimensional voltage amplification curve for the cable of FIG. 7 with the output filter circuit and the parallel RL circuit for a longer maximum cable distance.

Referring now to FIGS. 7-10, FIG. 8 shows another example voltage amplification curve for the cable of FIG. 1 with an output filter circuit 120 as shown in FIG. 1 or 2 at different distances along a cable of a first length X to inverter output over different frequencies of the inverter output signal. In this example, the length X is the same as in the example of FIGS. 4-6, and the voltage amplification and frequency scales are the same in FIGS. 5, 6, 8 and 9. A graph 800 in FIG. 8 shows an example voltage amplification curve 802 for the motor cable 108 of FIGS. 2 and 7 (length 110=X) with an output filter circuit 120 including the parallel RL circuit 124 described above. The curve 802 in FIG. 8 illustrates significant reduction in the voltage amplification and corresponding voltage stresses on the motor cable 108 due, at least in part, to the parallel RL circuit 124 in the output filter circuitry 120 for a given cable distance along the cable of the first distance for different frequencies. In addition, a graph 900 in FIG. 9 shows the two-dimensional front view of FIG. 8. Comparing FIGS. 5 and 6 with FIGS. 8 and 9, the use of the parallel RL circuit 124 advantageously provides significant reduction in voltage amplification and correspondingly reduced voltage stresses for a given motor cable 108. In one example, the distance X is 26.7 km. A graph 1000 in FIG. 10 shows another example voltage amplification curve 1002 for the cable 108 of FIG. 7 with the output filter circuit 120 and the parallel RL circuit 124 for different distances along the cable and different frequencies, for a longer maximum cable distance Y (Y>X). The graph 1000 illustrates that the disclosed concepts apply to extremely long motor cable lengths 110, and these concepts can be applied in reducing or mitigating voltage stresses on motor cables in a variety of applications requiring long motor cables 108. In one example, Y is 41.7 km, and the resulting maximum voltage amplification in the curve 1002 is well limited to approximately 2.734.

In the preceding specification, various embodiments have been described with reference to the accompanying drawings. It will be evident that various modifications and changes may be made thereto, and additional embodiments may be implemented, without departing from the broader scope of the invention as set forth in the claims that follow. The specification and drawings are accordingly to be regarded in an illustrative rather than restrictive sense.

The following is claimed:

1. A power conversion system, comprising:
   an inverter, including: a DC input, an inverter output, and a plurality of switching devices coupled between the DC input and the inverter output to provide an inverter output signal at the inverter output; and
   an output filter circuit coupled between an inverter output and a motor cable to suppress resonances along the motor cable;
   wherein the output filter circuit includes a cable side parallel RL circuit coupled between the inverter output and the motor cable, the cable side parallel RL circuit including:
      a resistor coupled in series between the inverter output and the motor cable, and
      an inductor connected in parallel with the resistor;
   wherein the power conversion system is a voltage source converter with a DC bus capacitor coupled with the DC input of the inverter;
   wherein the output filter circuit includes: a first inductor connected between the inverter output and an internal node, and a capacitor connected between the internal node and a reference node; and
   wherein the resistor and the inductor of the cable side parallel RL circuit are connected in parallel with one another between the internal node and the motor cable.

2. The power conversion system of claim 1,
   wherein the resistor of the cable side parallel RL circuit includes: a first terminal connected to the internal node, and a second terminal connected to the motor cable; and
   wherein the inductor of the cable side parallel RL circuit includes: a first terminal connected to the internal node, and a second terminal connected to the motor cable.

3. The power conversion system of claim 1, wherein the inverter output is a three phase output, wherein the output filter circuit is a three phase circuit, and wherein the cable side parallel RL circuit is a three phase circuit.

4. A power conversion system, comprising:
   an inverter, including: a DC input, an inverter output, and a plurality of switching devices coupled between the DC input and the inverter output to provide an inverter output signal at the inverter output; and
   an output filter circuit coupled between an inverter output and a motor cable to suppress resonances along the motor cable;
   wherein the output filter circuit includes a cable side parallel RL circuit coupled between the inverter output and the motor cable, the cable side parallel RL circuit including:
      a resistor coupled in series between the inverter output and the motor cable, and
      an inductor connected in parallel with the resistor;
   wherein the power conversion system is a current source converter with a DC link inductor coupled with the DC input of the inverter;
   wherein the output filter circuit includes: a capacitor connected between the inverter output and a reference node, the capacitor including a first terminal connected directly to the inverter output, and a second terminal connected directly to the reference node; and
   wherein the resistor and the inductor of the cable side parallel RL circuit are connected in parallel with one another between the inverter output and the motor cable.

5. The power conversion system of claim 4,
   wherein the resistor of the cable side parallel RL circuit includes: a first terminal connected to the inverter output, and a second terminal connected to the motor cable; and
   wherein the inductor of the cable side parallel RL circuit includes: a first terminal connected to the inverter output, and a second terminal connected to the motor cable.

6. The power conversion system of claim 4, wherein the inverter output is a three phase output, wherein the output filter circuit is a three phase circuit, and wherein the cable side parallel RL circuit is a three phase circuit.

7. The power conversion system of claim 1, wherein the inductor of the parallel RL circuit has an inductance value determined according to a characteristic impedance of the motor cable.

8. The power conversion system of claim 4, wherein the inductor of the parallel RL circuit has an inductance value determined according to a characteristic impedance of the motor cable.

9. A filter, comprising:
   a first filter circuit coupled with a filter input; and
   a parallel RL circuit coupled between the first filter circuit and a motor cable, the parallel RL circuit including:
      a resistor coupled in series between the first filter circuit and a filter output, and
      an inductor connected in parallel with the resistor;
   wherein the first filter circuit includes:
      a first inductor connected between the filter input and an internal node, and
      a capacitor connected between the internal node and a reference node; and
   wherein the resistor and the inductor of the parallel RL circuit are connected in parallel with one another between the internal node and the filter output.

10. The filter of claim 9,
    wherein the resistor of the parallel RL circuit includes:
       a first terminal connected to the internal node, and
       a second terminal connected to the motor cable; and
    wherein the inductor of the parallel RL circuit includes:
       a first terminal connected to the internal node, and
       a second terminal connected to the filter output.

11. The filter of claim 9, wherein the filter input is a three phase input, wherein the filter circuit is a three phase circuit, and wherein the parallel RL circuit is a three phase circuit.

12. A filter, comprising:
a first filter circuit coupled with a filter input; and
a parallel RL circuit coupled between the first filter circuit and a motor cable, the parallel RL circuit including:
 a resistor coupled in series between the first filter circuit and a filter output, and
 an inductor connected in parallel with the resistor;
wherein the first filter circuit includes a capacitor connected between the filter input and a reference node, the capacitor including a first terminal connected directly to the filter input, and a second terminal connected directly to the reference node; and
wherein the resistor and the inductor of the parallel RL circuit are connected in parallel with one another between the filter input and the filter output.

13. The filter of claim 12,
wherein the resistor of the parallel RL circuit includes:
 a first terminal connected to the filter input, and
 a second terminal connected to the filter output; and
wherein the inductor of the parallel RL circuit includes:
 a first terminal connected to the filter input, and
 a second terminal connected to the filter output.

14. The filter of claim 12, wherein the filter input is a three phase input, wherein the filter circuit is a three phase circuit, and wherein the parallel RL circuit is a three phase circuit.

15. The filter of claim 12, wherein the inductor of the parallel RL circuit has an inductance value determined according to a characteristic impedance of a motor cable.

16. The filter of claim 9, wherein the inductor of the parallel RL circuit has an inductance value determined according to a characteristic impedance of the motor cable.

17. A method of reducing voltage stress on a motor cable, comprising:
 connecting an output filter circuit with a cable side parallel RL circuit between an inverter output and a motor cable; and
 providing an inverter output signal from the inverter output to the output filter circuit to drive a load through the motor cable;
 wherein connecting the output filter circuit between the inverter output and the motor cable comprises:
  connecting a first inductor between the inverter output and an internal node;
  connecting a capacitor between the internal node and a reference node; and
  connecting the resistor and the inductor of the cable side parallel RL circuit in parallel with one another between the internal node and the motor cable.

18. A method of reducing voltage stress on a motor cable, comprising:
 connecting an output filter circuit with a cable side parallel RL circuit between an inverter output and a motor cable; and
 providing an inverter output signal from the inverter output to the output filter circuit to drive a load through the motor cable;
 wherein connecting the output filter circuit between the inverter output and the motor cable comprises:
  connecting a first terminal of a capacitor directly to the inverter output and connecting a second terminal of the capacitor directly to a reference node; and
  connecting the resistor and the inductor of the cable side parallel RL circuit in parallel with one another between the inverter output and the motor cable.

* * * * *